(12) United States Patent
Ishida et al.

(10) Patent No.: US 11,586,785 B2
(45) Date of Patent: Feb. 21, 2023

(54) INFORMATION PROCESSING APPARATUS, INFORMATION PROCESSING METHOD, AND PROGRAM

(71) Applicant: LIFULL Co., Ltd., Tokyo (JP)

(72) Inventors: Yota Ishida, Tokyo (JP); Satoshi Ueno, Tokyo (JP); Go Akiyama, Tokyo (JP); Yoji Kiyota, Tokyo (JP)

(73) Assignee: LIFULL Co., Ltd., Tokyo (JP)

( * ) Notice: Subject to any disclaimer, the term of this patent is extended or adjusted under 35 U.S.C. 154(b) by 815 days.

(21) Appl. No.: 16/461,267

(22) PCT Filed: Aug. 29, 2017

(86) PCT No.: PCT/JP2017/030868
§ 371 (c)(1),
(2) Date: May 15, 2019

(87) PCT Pub. No.: WO2018/092382
PCT Pub. Date: May 24, 2018

(65) Prior Publication Data
US 2019/0266293 A1    Aug. 29, 2019

(30) Foreign Application Priority Data

Nov. 17, 2016  (JP) .............................. JP2016-224076

(51) Int. Cl.
*G06T 7/60* (2017.01)
*G06T 19/00* (2011.01)
(Continued)

(52) U.S. Cl.
CPC ............. *G06F 30/13* (2020.01); *G06F 30/00* (2020.01); *G06F 30/23* (2020.01); *G06K 9/00* (2013.01);
(Continued)

(58) Field of Classification Search
CPC .................................. G06T 7/10; G06T 17/00
See application file for complete search history.

(56) References Cited

FOREIGN PATENT DOCUMENTS

| JP | 2001-195499 A | 7/2001 |
| JP | 2003-006674 A | 1/2003 |
| TW | I503781 B | 10/2015 |

OTHER PUBLICATIONS

Tabia, H., Riedinger, C., & Jordan, M. (2016). Automatic reconstruction of heritage monuments from old architecture documents. Journal of Electronic Imaging, 26(1), 011006. (Year: 2016).*
(Continued)

*Primary Examiner* — Bijan Mapar
(74) *Attorney, Agent, or Firm* — Levine Bagade Han LLP

(57) ABSTRACT

To provide an information processing apparatus, an information processing method, and a program that make it possible to suitably provide three-dimensional property information.
A floor-plan identifying unit that generates floor plan information on the basis of a floor plan image and a model generating unit that generates a three-dimensional model using the floor plan information are included. The floor-plan identifying unit includes: a line-segment detecting unit that detects a line segment corresponding to a wall on a floor plan, a segmentation processing unit that identifies a room region corresponding to a room on the floor plan, a character recognizing unit that recognizes a character string included in the floor plan image, a fixture detecting unit that detects a fixture sign included in the floor plan image, and an integration unit that identifies a type of room of the room region and complements a room structure. The model generating unit includes an estimating unit that estimates a scale of the floor plan and a generating unit that generates a three-dimensional model of the real-estate property on the basis of the floor plan identified from the floor plan information, the scale, and an estimated ceiling height.

7 Claims, 16 Drawing Sheets

(51) Int. Cl.
*G06T 7/00* (2017.01)
*G06T 17/00* (2006.01)
*G06F 30/00* (2020.01)
*G06T 7/10* (2017.01)
*G06F 30/13* (2020.01)
*G06T 7/13* (2017.01)
*G06K 9/00* (2022.01)
*G06Q 50/16* (2012.01)
*G06F 30/23* (2020.01)
*G06V 30/148* (2022.01)

(52) U.S. Cl.
CPC ............... *G06Q 50/16* (2013.01); *G06T 7/00* (2013.01); *G06T 7/10* (2017.01); *G06T 7/13* (2017.01); *G06T 7/60* (2013.01); *G06T 17/00* (2013.01); *G06T 19/00* (2013.01); *G06V 30/153* (2022.01)

(56) References Cited

OTHER PUBLICATIONS

Yin, X., Wonka, P., & Razdan, A. (2008). Generating 3d building models from architectural drawings: A survey. IEEE computer graphics and applications, 29(1), 20-30. (Year: 2008).*

* cited by examiner

INFORMATION PROCESSING APPARATUS, INFORMATION PROCESSING METHOD, AND PROGRAM

CROSS-REFERENCE TO RELATED APPLICATIONS

This application is a U.S. national stage application filed under 35 U.S.C. 371 of International Patent Application No. PCT/JP2017/030868 filed Aug. 29, 2017, which claims priority to Japanese Patent Application No. 2016-224076 filed Nov. 17, 2016, the contents of each of which are incorporated herein by reference in their entireties for all purposes.

TECHNICAL FIELD

The present invention relates to an information processing apparatus, an information processing method, and a program.

BACKGROUND ART

Services to provide information about properties, such as apartments, on Internet websites or the like have become popular in recent years. In such services, for example, a floor plan, photos of inside a property and its surrounding environment, and information on the address, area, etc. of the property are provided as property information.

A service to provide not only a two-dimensional floor plan but three-dimensional information at the time of provision of property information is also conceivable (for example, see Patent Documents 1 and 2). For example, Patent Document 2 discloses a technology to convert floor plan data acquired from a WEB server into a three-dimensional stereoscopic shape according to an instruction from the floor-plan viewer side, and as a result, a three-dimensional stereoscopic floor plan is displayed on a screen.

CITATION LIST

Patent Document

Patent Document 1: Japanese Patent Application Laid-Open No. 2001-195499
Patent Document 2: Japanese Patent Application Laid-Open No. 2003-006674

SUMMARY

Technical Problem

However, a specific technique pertaining to the generation of a concrete three-dimensional stereoscopic floor plan is not disclosed in Patent Documents 1 and 2.

Some of the aspects of the present invention have been made in view of the above-described problem, and one of the objects is to provide an information processing apparatus, an information processing method, and a program that make it possible to suitably provide three-dimensional property information.

Solution to Problem

An information processing apparatus according to one aspect of the present invention is an information processing apparatus including a first input unit that receives an input of a floor plan image of a real-estate property, a second input unit that receives an input of property information including area information of the real-estate property, a floor-plan identifying unit that generates floor plan information on the basis of the floor plan image, a model generating unit that generates a three-dimensional model of the real-estate property using the floor plan information, and an output unit that outputs the generated three-dimensional model. The floor-plan identifying unit includes a line-segment detecting unit that performs a contraction process and then a line-segment detection process on an image resulting from a binarization process performed on the floor plan image, and performs clustering on detected line segments, thereby detecting a line segment corresponding to a wall on a floor plan; a segmentation processing unit that performs opening of an morphological operation, which is a combination of an expansion process and a contraction process, and then a segmentation process on the floor plan image, thereby identifying a room region corresponding to a room on the floor plan; a character recognizing unit that recognizes a character string included in the floor plan image; a fixture detecting unit that detects a fixture sign included in the floor plan image; and an integration unit that identifies a type of room of the room region on the basis of the identified room region, a result of recognition of the character string, and a result of detection of the fixture sign, and complements a room structure on the basis of the room region and a result of detection by the line-segment detecting unit. The model generating unit includes an estimating unit that estimates a scale of the floor plan on the basis of the floor plan identified from the floor plan information and the area information included in the property information; and a generating unit that generates a three-dimensional model of the real-estate property on the basis of the floor plan identified from the floor plan information, the scale, and an estimated ceiling height.

An information processing method according to one aspect of the present invention is an information processing method for an information processing apparatus to perform a first step of receiving an input of a floor plan image of a real-estate property, a second step of receiving an input of property information including area information of the real-estate property, a third step of generating floor plan information on the basis of the floor plan image, a fourth step of generating a three-dimensional model of the real-estate property using the floor plan information, and a fifth step of outputting the generated three-dimensional model. The third step includes a step of performing a contraction process and then a line-segment detection process on an image resulting from a binarization process performed on the floor plan image, and performing clustering on detected line segments, thereby detecting a line segment corresponding to a wall on a floor plan; a step of performing opening of an morphological operation, which is a combination of an expansion process and a contraction process, and then a segmentation process on the floor plan image, thereby identifying a room region corresponding to a room on the floor plan; a step of recognizing a character string included in the floor plan image; a step of detecting a fixture sign included in the floor plan image; and a step of identifying a type of room of the room region on the basis of the identified room region, a result of recognition of the character string, and a result of detection of the fixture sign, and complementing a room structure on the basis of the room region and a result of the line-segment detection. The fourth step includes a step of estimating a scale of the floor plan on the basis of the floor plan identified from the floor plan information and the area information included in the property information; and a step of generating a three-dimensional model of the real-estate property on the basis of the floor plan identified from the floor plan information, the scale, and an estimated ceiling height.

A program according to one aspect of the present invention is a program causing an information processing apparatus to execute a first process of receiving an input of a floor plan image of a real-estate property, a second process of receiving an input of property information including area information of the real-estate property, a third process of generating floor plan information on the basis of the floor plan image, a fourth process of generating a three-dimensional model of the real-estate property using the floor plan information, and a fifth process of outputting the generated three-dimensional model. The third process includes a process of performing a contraction process and then a line-segment detection process on an image resulting from a binarization process performed on the floor plan image, and performing clustering on detected line segments, thereby detecting a line segment corresponding to a wall on a floor plan; a process of performing opening of an morphological operation, which is a combination of an expansion process and a contraction process, and then a segmentation process on the floor plan image, thereby identifying a room region corresponding to a room on the floor plan; a process of recognizing a character string included in the floor plan image; a process of detecting a fixture sign included in the floor plan image; and a step of identifying a type of room of the room region on the basis of the identified room region, a result of recognition of the character string, and a result of detection of the fixture sign, and complementing a room structure on the basis of the room region and a result of the line-segment detection. The fourth step includes a step of estimating a scale of the floor plan on the basis of the floor plan identified from the floor plan information and the area information included in the property information; and a step of generating a three-dimensional model of the real-estate property on the basis of the floor plan identified from the floor plan information, the scale, and an estimated ceiling height.

Incidentally, in the present invention, "unit", "means", "apparatus", and "system" do not mean only a physical means and include a case where the functions the "unit", "means", "apparatus", or "system" has are realized by software. Furthermore, the functions one "unit", "means", "apparatus", or "system" has can be realized by two or more physical means or apparatuses, or the functions two or more "units", "means", "apparatuses", or "systems" have can be realized by one physical means or apparatus.

DESCRIPTION OF EMBODIMENTS

Figure 1:
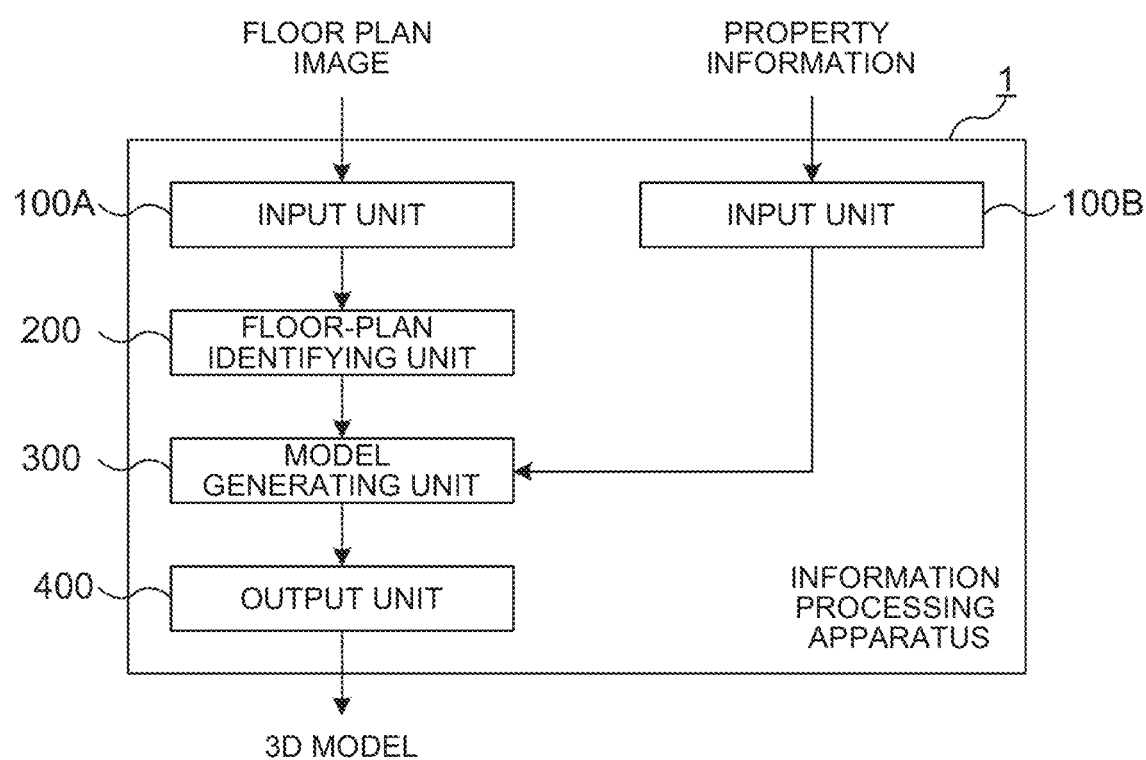
FIG. 1 is a diagram showing a functional configuration of an information processing apparatus according to an embodiment.

An embodiment of the present invention is described below with reference to drawings. However, the embodiment described below is just an example, which does not mean to exclude the application of various modifications and technologies not specified below. That is, the present invention can be put into practice with various modifications made without departing from the scope of the invention. Furthermore, in the following description of drawings, the same or similar component is assigned the same or similar reference numeral. The drawings are schematic ones, and do not always correspond to the actual dimensions or proportion, etc. Also between drawings, they may include a part that differs from each other in the dimensional relationship or the proportion.

First Embodiment

1 Overview

Real-estate information providing services have become widely popular in recent years. In such real-estate information providing services, using a browser or a dedicated application running on a cell phone (regardless of whether it is a so-called feature phone or a smartphone) or a personal computer, users can check information about properties such as apartments or houses available for rent or purchase. Property information includes, for example, a floor plan, photos of inside a property and its surrounding environment, and information on the address, area, etc. of the property.

However, users have difficulty getting a residential image from such numerical, literal, and two-dimensional information only. It is also conceivable to manually create a three-dimensional virtual space image, i.e., a 3D model one by one; however, it is difficult to create 3D models of all a large quantity of real-estate properties.

Therefore, an information processing apparatus according to the present embodiment automatically generates a 3D model of a real-estate property from property information including a floor plan image, interior photos, etc. Accordingly, based on the generated 3D model, the information processing apparatus enables the room viewing and interior simulation in virtual reality (VR) and further the online business talk through which a user can check the actual interior finishing and a surrounding environment from his/her home without going to the actual site. Furthermore, the guidance for viewing or the like is also made possible through a call to sales staff of a real-estate company in a virtual space of the 3D model. In addition, the sale of the property and the sale of furniture can also be consolidated by having an interior coordinator's proposal for the interior in the virtual space.

Thus, the information processing apparatus according to the present embodiment can let a user have a residential image of each of real-estate properties existing in large quantity and, as a result, promote relocation.

2 Functional Configuration 2.1 Entire Functional Configuration

FIG. 1 shows a functional configuration of an information processing apparatus 1 according to a first embodiment. As shown in FIG. 1, the information processing apparatus 1 includes input units 100A and 100B, a floor-plan identifying unit 200, a model generating unit 300, and an output unit 400.

Figure 4:
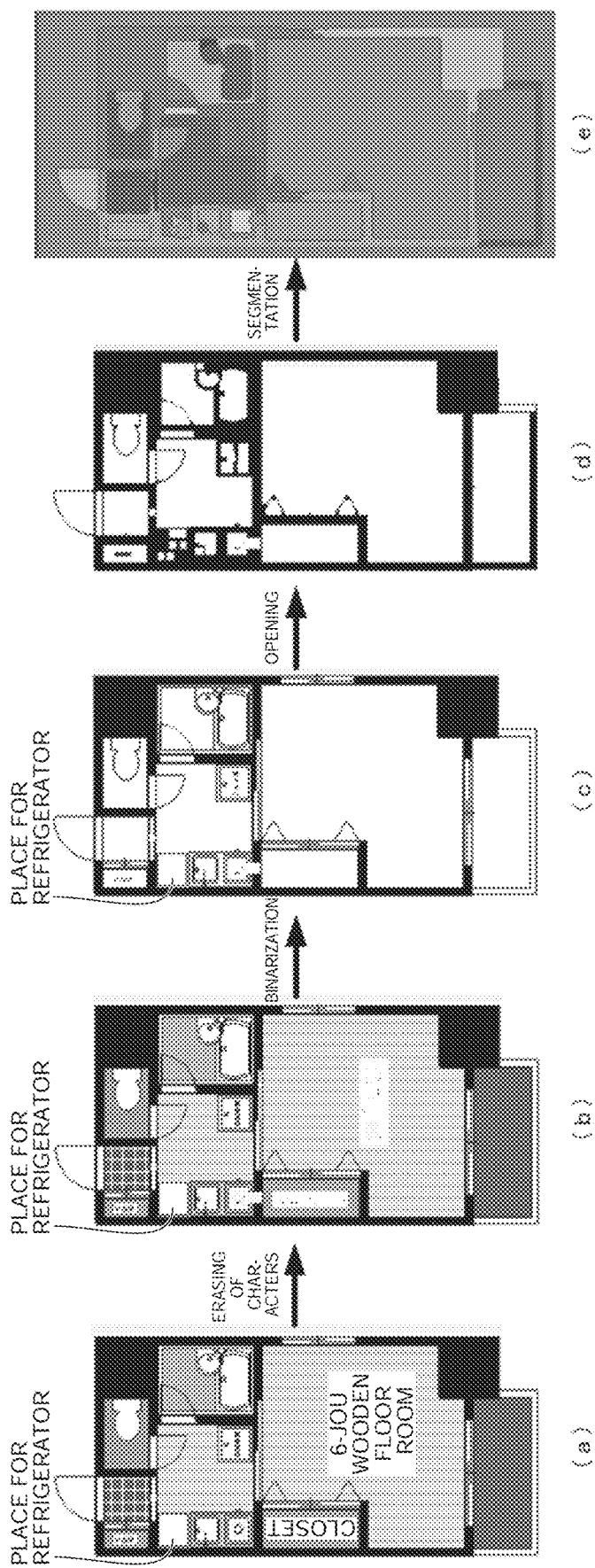
FIG. 4 is a diagram for explaining an embodiment of part of processing by the floor-plan identifying unit shown in FIG. 2.
Figure 5:
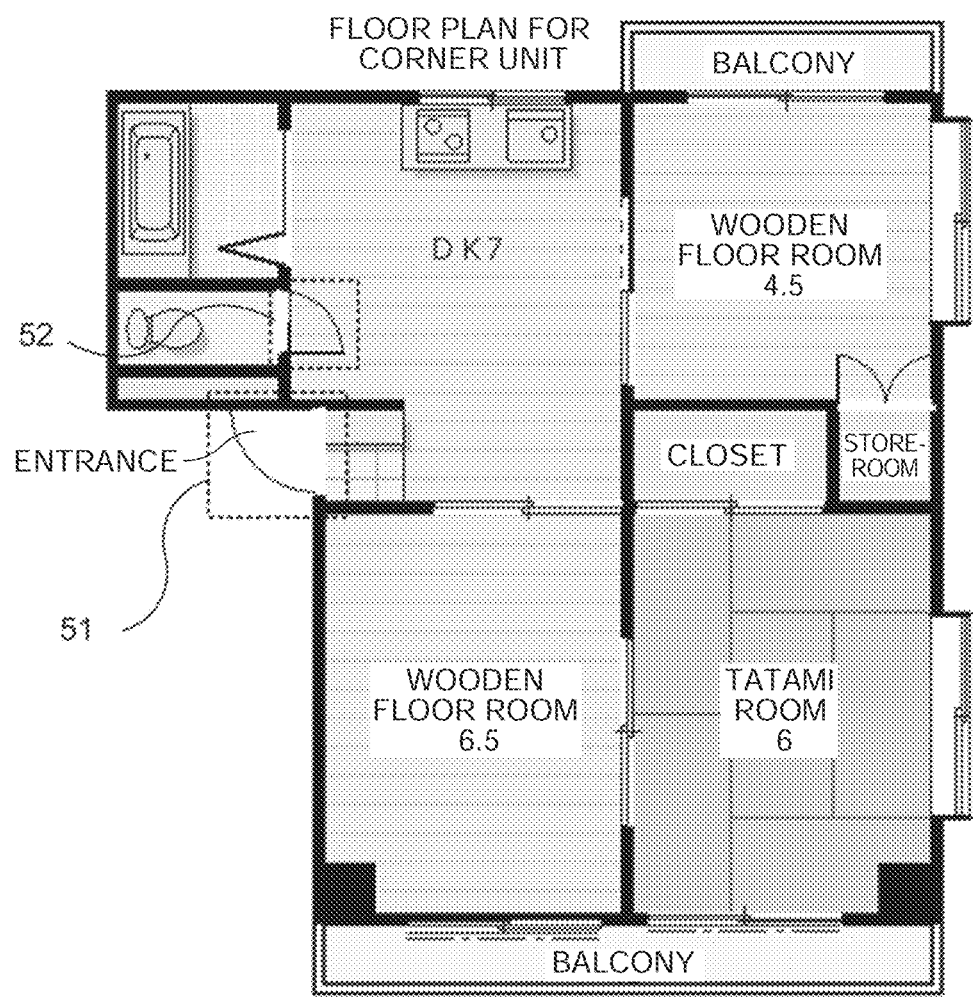
FIG. 5 is a diagram showing a concrete example of a floor plan image.

The input unit 100A reads, for example, a floor plan image having stored in a storage medium such as a hard disk drive (HDD) in advance or a floor plan image, etc. received from another information processing apparatus via a network. Concrete examples of a floor plan image are shown in FIGS. 3(a), 4(a), 5, etc. to be described later.

The input unit 100B reads various information (property information) on a property pertaining to a floor plan image read by the input unit 100A. The property information read by the input unit 100B can include, for example, photos shot inside the property, location information (the address, the latitude/longitude, or the like), and information such as the azimuth, the floor number, the age of the property, and the exclusive area.

The floor-plan identifying unit 200 performs an analysis on a floor plan image input from the input unit 100A. A floor-plan analysis result obtained as a result of the analysis can include the positions of walls, regions of rooms, purposes of the rooms (dining, bath, etc.), detection of fixtures (a bath, a toilet bowl, a door, etc.), and so forth. The functions and configuration of the floor-plan identifying unit 200 will be described later with reference to FIG. 2, etc.

The model generating unit 300 generates a 3D model of a target property, using a result of an analysis of a floor plan image made by the floor-plan identifying unit 200 and property information input from the input unit 100B. The functions and configuration of the model generating unit 300 will be described later with reference to FIG. 12, etc.

The output unit 400 outputs a 3D model generated by the model generating unit 300 to the outside. Various methods for the output by the output unit 400 are conceivable. For example, it is conceivable that the output unit 400 outputs the 3D model as part of Web contents so that a user can view inside the 3D model represented as a virtual space through a client terminal while changing his/her viewpoint arbitrarily (while moving in the virtual space). Alternatively, it is also conceivable that the output unit 400 outputs the generated 3D model to various storage media such as an HDD and a flash memory. However, the method of the output by the output unit 400 is not limited to these.

2.2 Functional Configuration of Floor-Plan Identifying Unit 200

Figure 2:
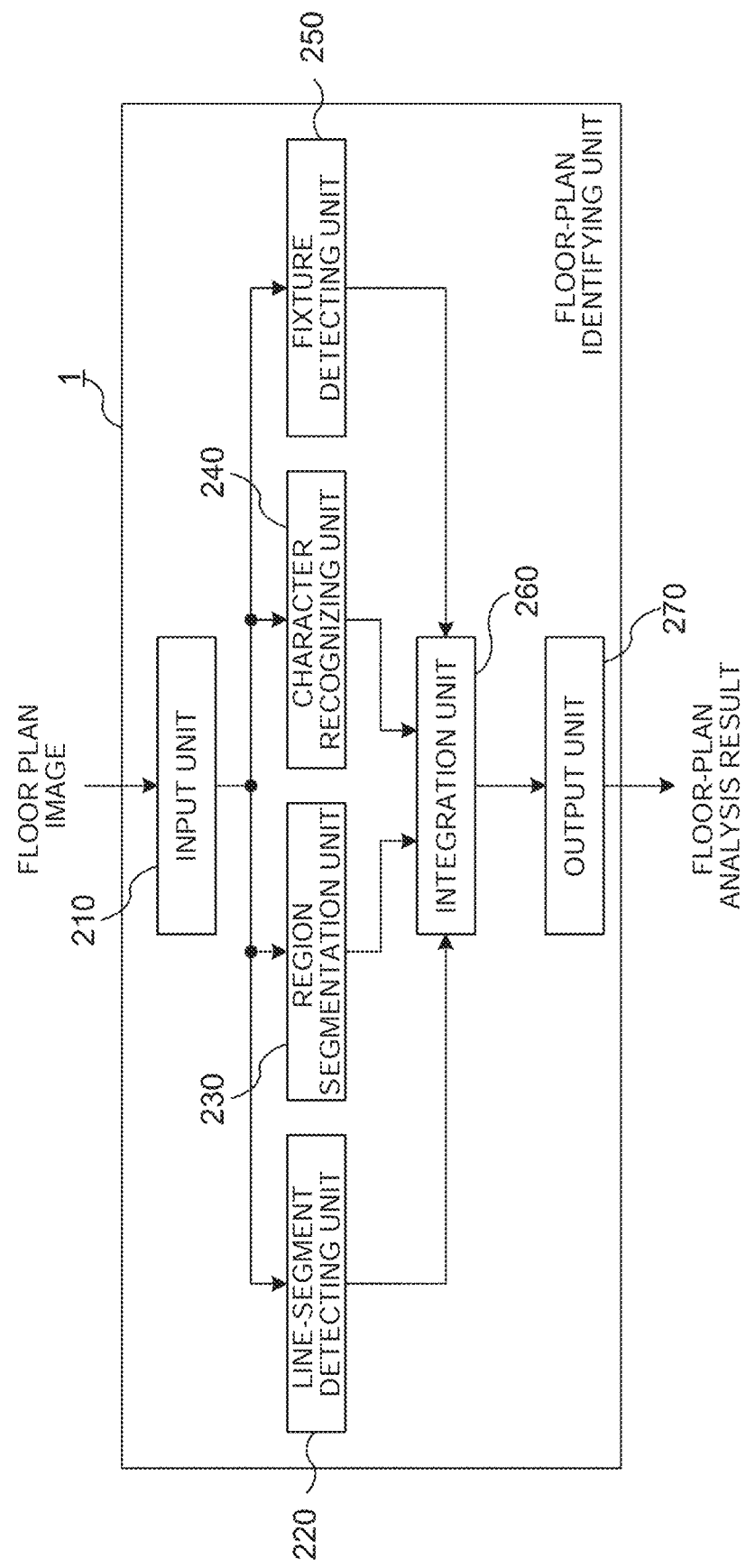
FIG. 2 is a diagram showing a functional configuration of a floor-plan identifying unit of the information processing apparatus shown in FIG. 1.

Subsequently, the functional configuration of the floor-plan identifying unit 200 is described with reference to FIG. 2. As shown in FIG. 2, the floor-plan identifying unit 200 includes an input unit 210, a line-segment detecting unit 220, a region segmentation unit 230, a character recognizing unit 240, a fixture detecting unit 250, an integration unit 260, and an output unit 270.

The input unit 210 is an interface that receives an input of a two-dimensional floor plan image of a property input from the input unit 100A shown in FIG. 1. The input unit 210 outputs the input floor plan image to each of the line-segment detecting unit 220, the region segmentation unit 230, the character recognizing unit 240, and the fixture detecting unit 250.

The line-segment detecting unit 220 analyzes the floor plan image, thereby detecting a line segment estimated to correspond to a wall. Details of processing by the line-segment detecting unit 220 will be described later with reference to FIG. 3.

The region segmentation unit 230 analyzes the floor plan image, thereby detecting a region segmentation estimated to correspond to each room. Details of processing by the region segmentation unit 230 will be described later with reference to FIG. 4.

Figure 10:
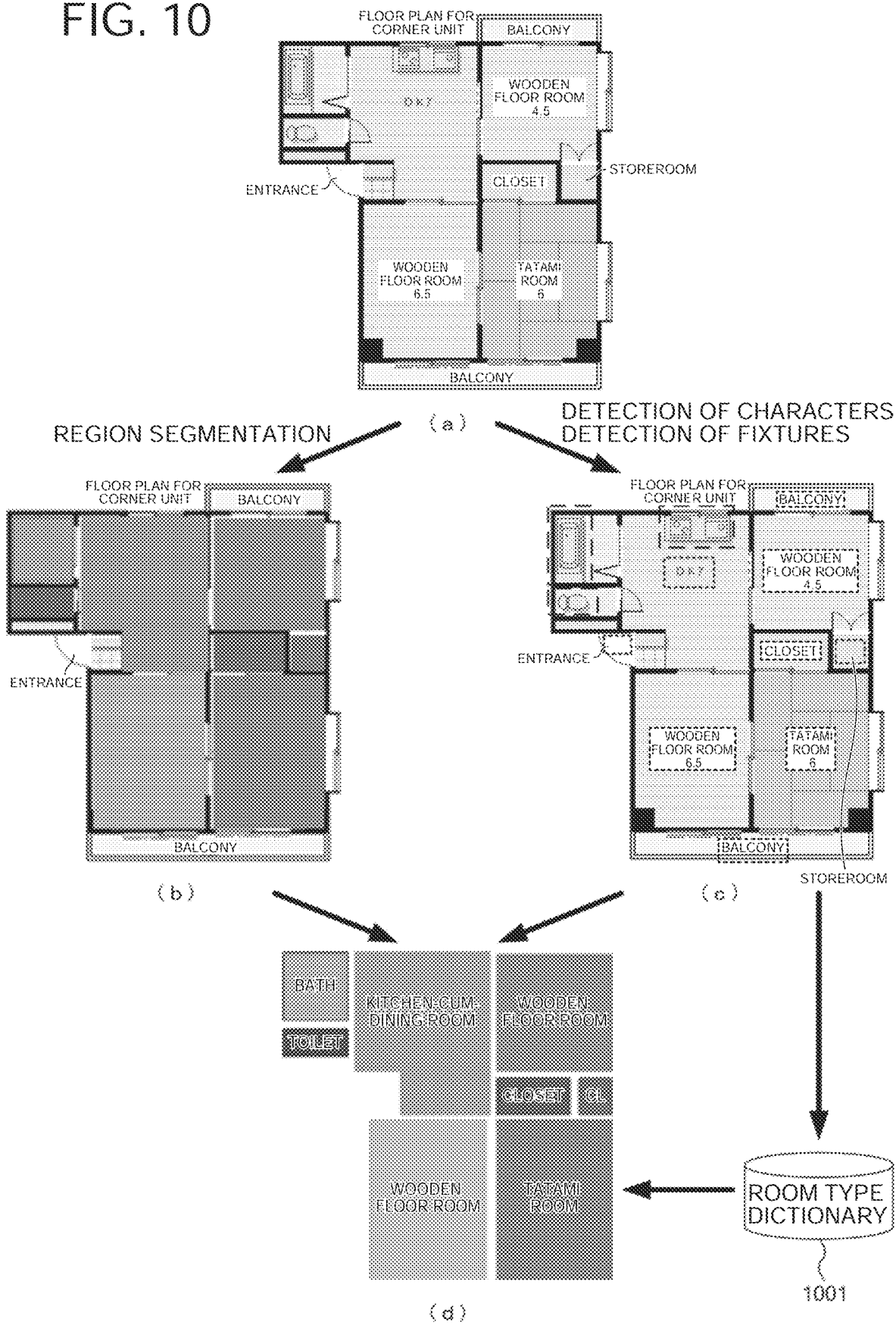
FIG. 10 is a diagram for explaining an embodiment of part of processing by the floor-plan identifying unit shown in FIG. 2.

The character recognizing unit 240 analyzes the floor plan image, thereby detecting a character string included in the floor plan image. For example, in an example of a floor plan image shown in FIGS. 3(a) and 5, the character recognizing unit 240 can detect character strings "Tatami room 6", "Wooden floor room 6.5", "DK 7", "Wooden floor room 4.5", "Entrance", "Closet", "Storeroom", "Balcony", etc. The character recognizing unit 240 refers to a room type dictionary 1001 with the detected character string as a key as shown in FIG. 10 to be described later and thereby can identify what type of room the character string indicates. For example, if a description to the effect that a character string "DK" indicates "kitchen-cum-dining room" has been registered in the room type dictionary, the character recognizing unit 240 can output information "kitchen-cum-dining room" to the integration unit 260 in a manner associated with the coordinates where the character string "DK 7" has been arranged. Furthermore, if a number such as "7" or "6.5" has been detected, as the number is considered to be information corresponding to, for example, the number of tatami mats or the like in a room, the character recognizing unit 240 can output the number to the integration unit 260 in a manner associated with the position coordinates where the character string has been arranged.

The fixture detecting unit 250 analyzes the floor plan image, thereby detecting a fixture from a sign or the like included in the floor plan image. For example, the fixture detecting unit 250 detects a toilet bowl sign (toilet), a bathtub sign (bath), a door sign, a built-in kitchen sign (kitchen), etc. A detection process performed by the fixture detecting unit 250 will be described later with reference to FIG. 6.

The integration unit 260 generates a floor-plan analysis result by integrating results of the analyses by the line-segment detecting unit 220, the region segmentation unit 230, the character recognizing unit 240, and the fixture detecting unit 250. The method of the integration will be described later with reference to FIGS. 9 to 11.

The output unit 270 is an interface that outputs the floor-plan analysis result generated by the integration unit 260 to the model generating unit 300 in order to generate a 3D model.

2.2.1 Processing by Line-Segment Detecting Unit 220

Figure 3:
FIG. 3 is a diagram for explaining an embodiment of part of processing by the floor-plan identifying unit shown in FIG. 2.

An embodiment of processing by the line-segment detecting unit 220 is described below with reference to a concrete example of images in FIG. 3. FIG. 3(a) is a concrete example of a floor plan image input to the line-segment detecting unit 220.

The line-segment detecting unit 220 first converts the input floor plan image (FIG. 3(a)) into a gray-scale having pixels whose pixel values are any of 0 to 255. Then, the line-segment detecting unit 220 generates a black-and-white binarized image by binarizing each of the pixel values to white if it is equal to or more than a threshold (for example, 100) or black if it is less than the threshold. FIG. 3(b) shows a concrete example of the black-and-white image that the floor plan image in FIG. 3(a) has been binarized. Incidentally, in the example of FIG. 3(b), the colors of black and white have been inverted.

Next, the line-segment detecting unit 220 performs a contraction process on the generated black-and-white binarized image. A brief description of the contraction process is provided below. In the contraction process, out of pixel values of pixels located in a nearby region of a processing target pixel, the minimum value shall be a pixel value of the processing target pixel. For example, provided that 3×3 pixels around the processing target pixel is a nearby region, if there is even one pixel whose value is 0 (black) in the 3×3 pixels, a pixel value of the processing target pixel shall be 0. On the other hand, if pixel values of all the pixels located in the nearby region are 1 (white), a pixel value of the processing target pixel shall be 1. Incidentally, in an expansion process opposite to the contraction process, out of pixel values of pixels located in a nearby region of a processing target pixel, the maximum value shall be a pixel value of the processing target pixel. For example, provided that 3×3 pixels around the processing target pixel is a nearby region, if there is even one pixel whose value is 1 (white) in the 3×3 pixels, a pixel value of the processing target pixel shall be 1. On the other hand, if pixel values of all the pixels located in the nearby region are 0 (black), a pixel value of the processing target pixel shall be 0. Incidentally, in the contraction process or the expansion process, the size of the nearby region is arbitrary; for example, an arbitrary region, such as 4×4 pixels, can be set as the nearby region.

FIG. 3(c) shows a result of the contraction process performed on the binarized image shown in FIG. 3(b). As shown in FIG. 3(c), in a contracted image, wall portions drawn thick in FIG. 3(b) are depicted in a little thin line, and lines, character strings, etc. representing the fixtures, such as windows and the kitchen, drawn in a line thinner than the walls become almost invisible.

Incidentally, in a case where a bold character is included in the floor plan, the bold character may remain visible even after the contraction process and be detected as a wall. Accordingly, it is also conceivable that a character detecting process is performed on the floor plan image in advance, and preprocessing of painting out a portion determined to be a character string in the color of a region surrounding the character string in advance.

Then, the line-segment detecting unit 220 performs line-segment detection on the image having been subjected to the contraction process. Various techniques for the line-segment detection process are conceivable; for example, it is conceivable to use probabilistic Hough transform. In probabilistic Hough transform, with respect to the image having been subjected to the contraction process shown in FIG. 3(c) as a concrete example, first, a straight line through more feature points (in the present embodiment, pixels whose pixel values are white) is detected by Hough transform. Next, the line-segment detecting unit 220 detects a portion (a line segment) where a line exists with a particularly high probability in the detected straight line.

Incidentally, the method of the line-segment detection is not limited to a technique using the probabilistic Hough transform, and, for example, a technique using a line segment detector (LSD) is also conceivable.

FIG. 3(d) shows a concrete example of the image having been subjected to the line-segment detection process performed on the image shown in FIG. 3(c) by the line-segment detecting unit 220. As shown in FIG. 3(d), the portions represented as walls in the floor plan image shown in FIG. 3(a) are each represented as a line segment.

The line-segment detecting unit 220 further performs a clustering process for consolidating line segments considered to be generated from one line with respect to each of the line segments detected through the line-segment detection process. In a case where a line responsible for the detection of a line segment is thick or depending on the state of the image, as a result of the line-segment detection process, two line segments may be detected in one wall. Therefore, whether or not respective coordinates of the start and end points of one of the lines are close to on line of the other line is determined, and, if the start and end points of the one line are both close to the other line, the line-segment detecting unit 220 performs a clustering process of consolidating the one line into the other line. FIG. 3(e) shows an example of an image obtained after the clustering process has been performed on the result of the line-segment detection in FIG. 3(d). Line segments obtained as a result can be regarded as parts corresponding to the walls in the floor plan image.

2.2.2 Processing by Region Segmentation Unit 230

Subsequently, an embodiment of processing by the region segmentation unit 230 is described with reference to a concrete example of images in FIG. 4. FIG. 4(a) is a concrete example of a floor plan image input to the region segmentation unit 230.

The region segmentation unit 230 first performs character-string detection on the input floor plan image. The region segmentation unit 230 performs, as preprocessing, a character erasing process of painting out a portion determined to be a character string as a result of the character-string detection in the color of a region surrounding the character string. FIG. 4(b) shows an example of the image having been subjected to the character erasing process.

The region segmentation unit 230 performs a binarization process on the image having been subjected to the character erasing process, thereby generating a binarized image shown in FIG. 4(c) as a concrete example. The method of generating a binarized image is described above with reference to FIG. 3, and therefore description of this method is omitted here.

The region segmentation unit 230 performs opening of a morphological operation on the generated binarized image. Opening means performing a contraction process after an expansion process has been performed on a processing target image. Incidentally, the combination of the expansion process and the contraction process can be performed more than once. The expansion process and the contraction process are described above with reference to FIG. 3, and therefore description of these processes is omitted here. FIG. 4(d) shows a concrete example of the image having been subjected to the opening. From the example of FIG. 4(d), it can be seen that most of the portions representing windows, sliding doors, etc. in the floor plan image in FIG. 4(a) have become thick black lines and been represented in the same way as the walls.

The region segmentation unit 230 performs a segmentation process on the image generated through the opening. In the segmentation process on, the region segmentation unit 230 extracts a region in which there are continuous pixels having the same pixel value in the binarized image. thereby dividing the image into multiple regions. The regions generated in this way are presumed to be portions corresponding to rooms on the floor plan image.

Incidentally, the region segmentation process is not limited to the technique described above with reference to FIG. 4. For example, adding various processes other than those described above before the segmentation process are also conceivable to improve the accuracy. Or, without generating the binarized image, the segmentation can be performed by means of the color feature. In this case, by means of the color feature, the texture feature, or the like, regions having a similar feature can be determined to be a region indicating the same segmentation. Using other segmentation techniques, for example, graph cuts or region growth, edge detection, deep learning (Convolutional neural network), divide-and-conquer method, etc. are also conceivable.

2.2.3 Processing by Fixture Detecting Unit 250

An embodiment of processing by the fixture detecting unit 250 is described with reference to FIGS. 5 to 8. As described above, the fixture detecting unit 250 detects a fixture depicted as a sign (hereinafter, also referred to as a fixture sign) in a floor plan image. As fixtures to be detected, for example, a toilet bowl (toilet), a bathtub (bath), a door, a built-in kitchen (kitchen), etc. are conceivable. Here, a case of detecting a door is described mainly. In an example of a floor plan image shown in FIG. 5, a door sign 51 corresponding to an entrance door and a door sign 52 indicating to a toilet door are included in the floor plan image. The fixture detecting unit 250 detects the door signs 51 and 52.

Figure 6:
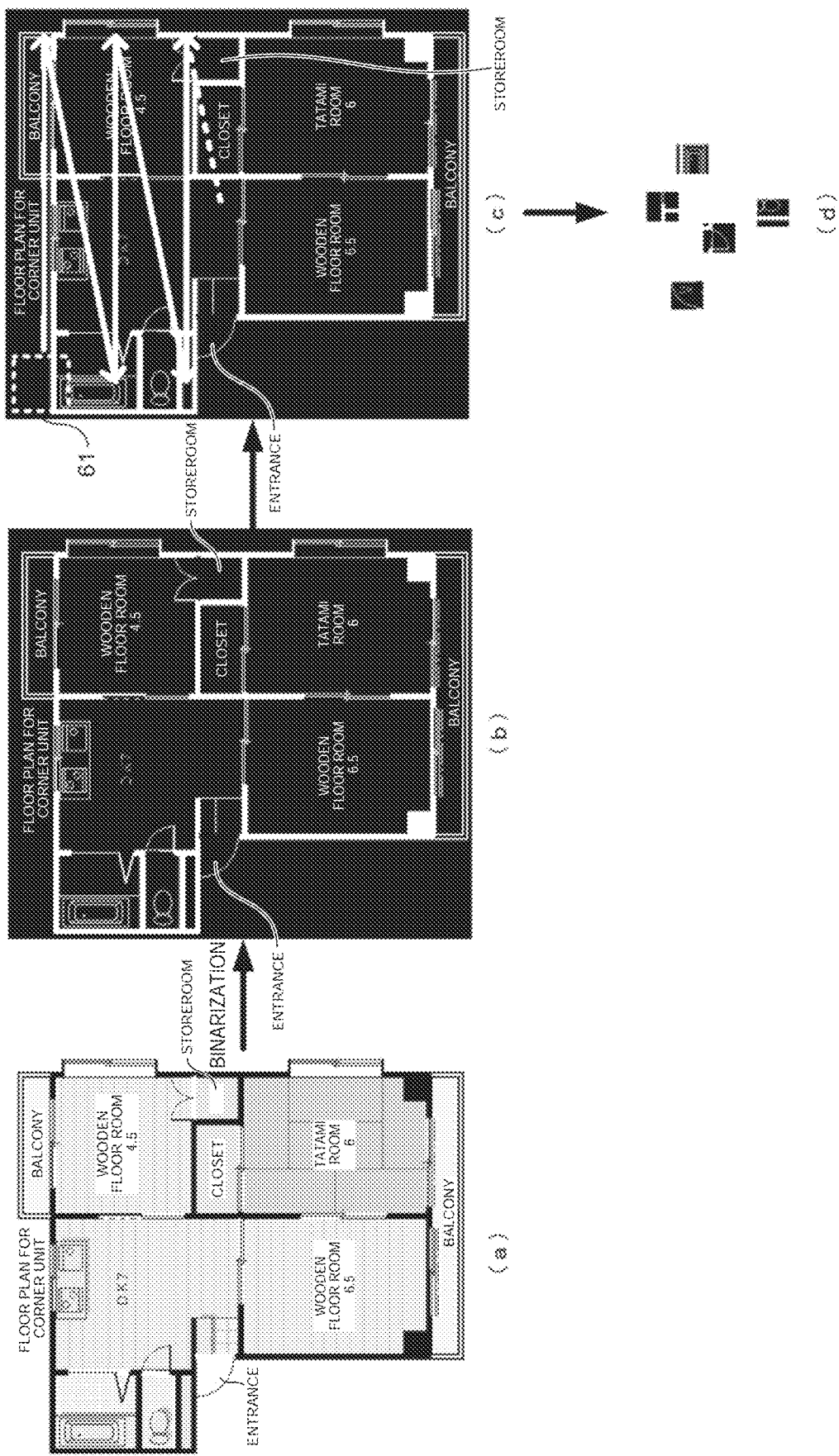
FIG. 6 is a diagram for explaining an embodiment of part of processing by the floor-plan identifying unit shown in FIG. 2.

The flow of processing by the fixture detecting unit 250 is described below with reference to FIG. 6. First, the fixture detecting unit 250 performs various image processing, such as binarization, on a floor plan image shown in FIG. 6(a) as a concrete example. FIG. 6(b) shows an example of an image having been subjected to the image processing. Next, the fixture detecting unit 250 sequentially scans the image having been subjected to the image processing (FIG. 6(c)), thereby extracting a sign candidate region (FIG. 6(d)). At this time, by changing the size of a sign candidate region and scanning the image several times, the sign candidate regions of various sizes can be extracted.

Incidentally, the method of extracting a sign candidate region is not limited to scanning on a target image. For example, it is also conceivable that a sign candidate region is selected by grouping similar regions at the pixel level by selective search.

The fixture detecting unit 250 calculates a feature amount of each sign candidate region generated in this way. Various feature amounts that the fixture detecting unit 250 calculates of a sign candidate region are conceivable; for example, the HOG (Histograms of Oriented Gradients) feature amount is conceivable. In a case of using the HOG feature amount, first, the fixture detecting unit 250 divides an input image (a sign candidate region here) into blocks of, for example, 8×8 pixels. Next, the fixture detecting unit 250 calculates the intensity gradient (the edge direction) in a local region, from a bright portion toward a dark portion, with respect to each of respective pixels included in the blocks. By adding up this intensity gradient in each block, as many intensity gradient histograms as the number of the blocks are generated. This aggregation of histograms is an HOG feature amount. Incidentally, the feature amount calculated by the fixture detecting unit 250 is not limited to the HOG feature amount, and can be, for example, other feature amounts such as SIFT (Scale-Invariant Feature Transform), SURF (Speeded Up Robust Features), and LBP (Local Binary Pattern).

The feature amount of each sign candidate region calculated in this way is input to a detector for detecting a fixture sign to be detected (a door sign here), thereby whether or not the sign candidate region is a fixture sign to be detected can be determined.

Figure 7:
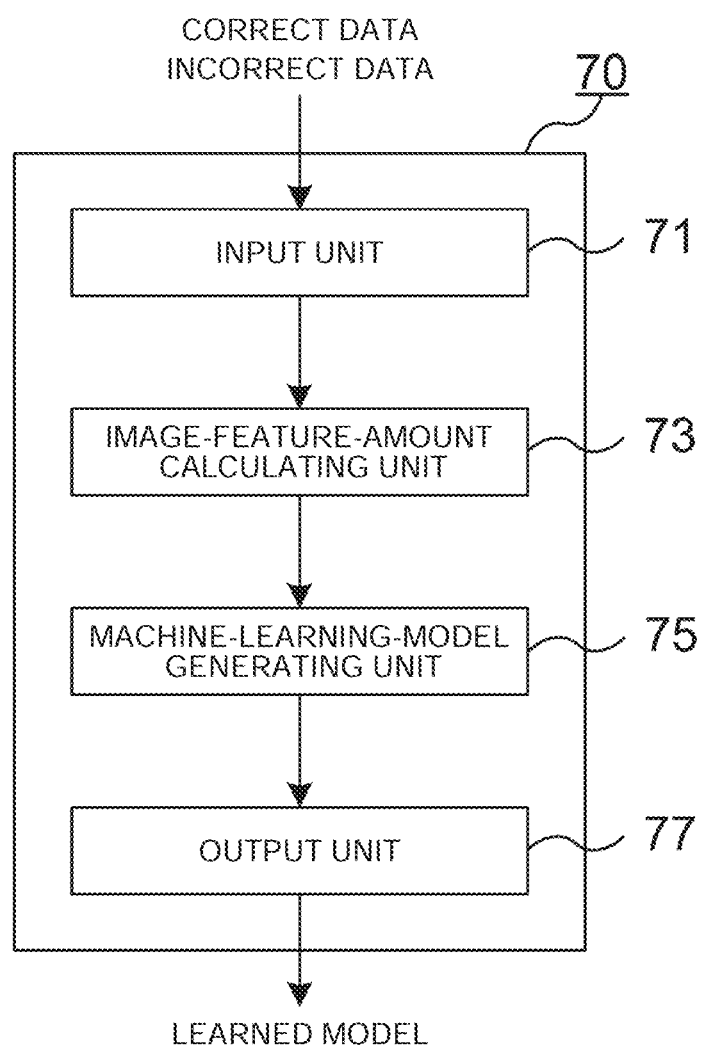
FIG. 7 is a diagram showing an embodiment of a functional configuration of an information processing apparatus that generates a classifier.
Figure 8:
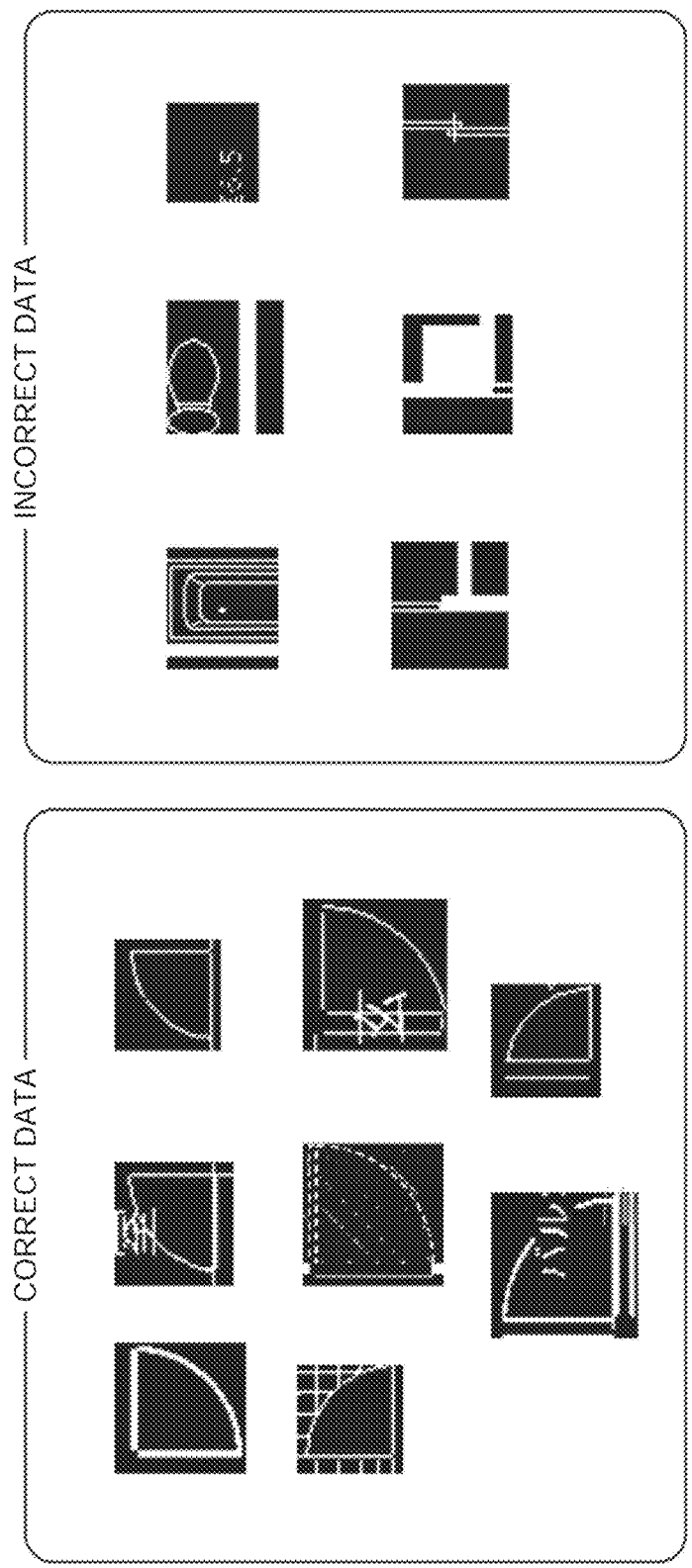
FIG. 8 is a diagram showing an embodiment of training data input to the classifier shown in FIG. 7.

An embodiment of a method of generating a detector for detecting a fixture sign (a door sign here) is described below with reference to FIGS. 7 to 8. FIG. 7 is a diagram showing a functional configuration of an information processing apparatus 70 that generates the detector for detecting a fixture sign. As shown in FIG. 7, the information processing apparatus 70 includes an input unit 71, an image-feature-amount calculating unit 73, a machine-learning-model generating unit 75, and an output unit 77.

The input unit 71 receives inputs of correct data and incorrect data (hereinafter, collectively referred to as training data) necessary to generate a machine learning model that is a detector. FIG. 8 shows a concrete example of the correct data and incorrect data input to the input unit 71. The input data is composed of a combination of information (for example, a flag) indicating correct data or incorrect data and an image.

The image-feature-amount calculating unit 73 calculates an image feature amount from the image of the input training data. As long as the feature amount calculated here is the same as the feature amount calculated by the above-described fixture detecting unit 250, any of HOG, SIFT, SURF, LBP, and the like can be used.

The machine-learning-model generating unit 75 performs machine learning using the calculated image feature amount and the information indicating correct data or incorrect data. Various machine learning techniques are conceivable; for example, deep learning using Convolutional neural network is conceivable. In this learning method, for each input of training data, parameters of nodes composing a neural network that is a machine learning model vary. A large number of training data inputs enable the machine learning model to suitably determine whether it is correct or incorrect (whether it is a door sign or not).

The output unit 77 outputs the machine learning model generated in this way as a detector for detecting a fixture sign.

Incidentally, in the above-described embodiment of the fixture detecting unit 250, after a sign candidate region of an input floor plan image is selected, the sign candidate region is input to a detector that is a machine learning model, thereby a fixture to be detected is detected; however, the way to detect a fixture is not limited to this. For example, it is also conceivable that the fixture detecting unit 250 detects a fixture by using a deep learning technique for performing from the selection of a sign candidate region to the determination of a fixture sign to be detected, such as Faster R-CNN.

2.2.4 Processing by Integration Unit 260

Figure 9:
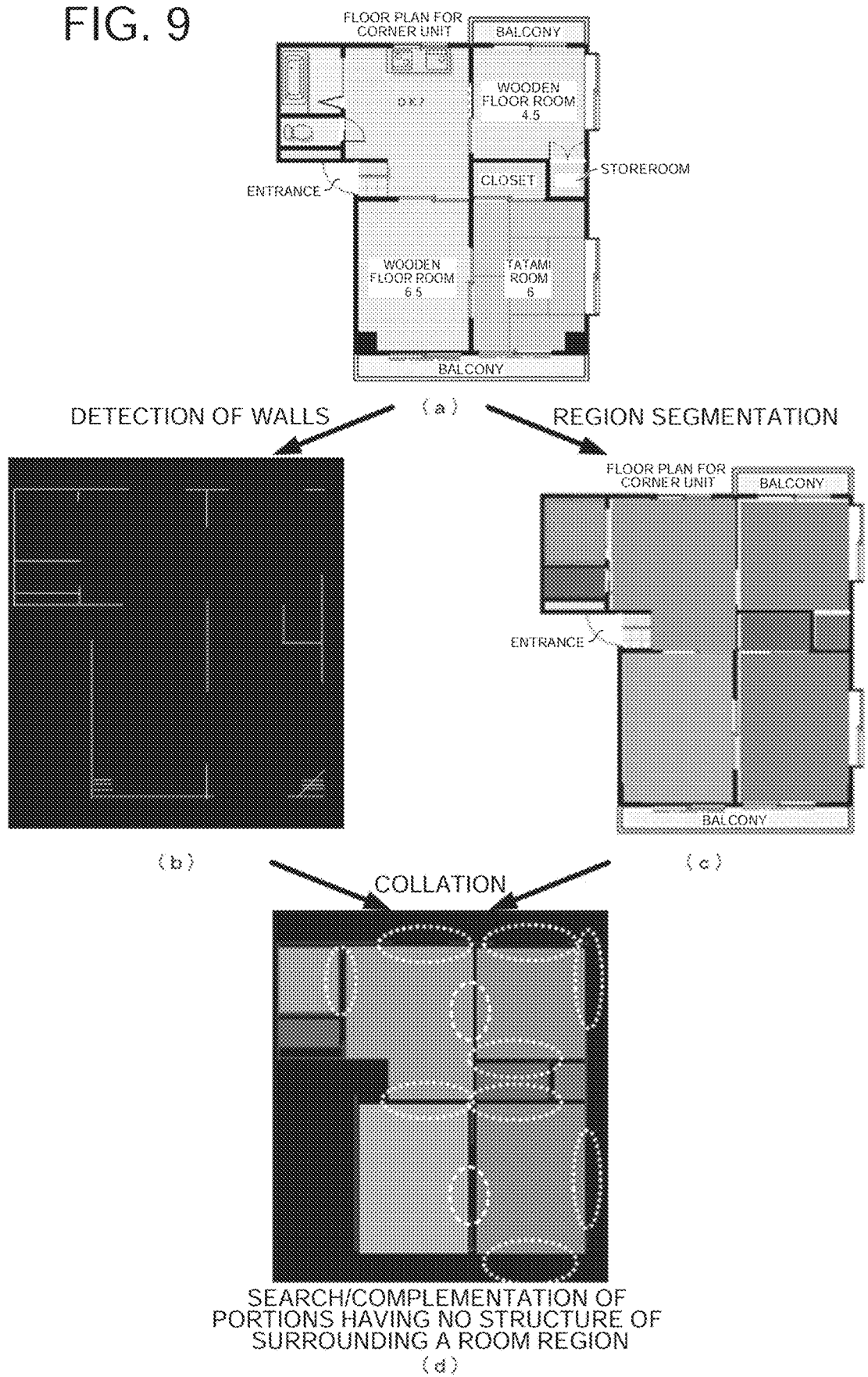
FIG. 9 is a diagram for explaining an embodiment of part of processing by the floor-plan identifying unit shown in FIG. 2.

An embodiment of processing by the integration unit 260 is described with reference to FIGS. 9 to 11. As described above, the integration unit 260 integrates results of the detection by the line-segment detecting unit 220, the region segmentation unit 230, the character recognizing unit 240, and the fixture detecting unit 250, thereby generating a floor-plan analysis result.

First, a method of integrating a result of the detection by the line-segment detecting unit 220 and a result of the detection by the region segmentation unit 230 is described with reference to FIG. 9. As described above, the line-segment detecting unit 220 detects a line segment corresponding to a wall of a property (FIG. 9(*b*)) in a floor plan image (FIG. 9(*a*)) input to the input unit 210. The region segmentation unit 230 detects a region corresponding to a room (FIG. 9(*c*)) in the floor plan image (FIG. 9(*a*)).

Here, each room is generally surrounded by walls, a window, a door, a sliding door, etc. Therefore, each region (hereinafter, a room region) detected as a room as a result of the region segmentation is considered to be supposed to be surrounded by a window, a door, etc. in addition to line segments detected as walls as a result of the line-segment detection. Accordingly, the integration unit 260 collates the result of the detection by the line-segment detecting unit 220 and the result of the detection by the region segmentation unit 230 so as to be in position (FIG. 9(*d*)). As a result, if there is an open portion of a line segment in the periphery of the room region (a dotted line portion in FIG. 9(*d*)), the integration unit 260 sets the portion as a portion corresponding to a window, a door, or a sliding door. Specifically, for example, an open portion to the outside can be set as a window or a door, and a boundary portion between room regions can be set as a sliding door or a door. Through such processing, the integration unit 260 can obtain a room structure. Incidentally, as to a door portion, a result of the detection of a door sign by the fixture detecting unit 250 can also be used. In this case, portions other than the one detected as a door can be set as a sliding door and a window.

Next, a method of integrating a result of the detection by the region segmentation unit 230 and results of the detection by the character recognizing unit 240 and the fixture detecting unit 250 is described with reference to FIG. 10.

As described above, the region segmentation unit 230 detects a region corresponding to a room from a floor plan image (FIG. 10(*a*)). However, what feature each room has (for example, whether it is a kitchen, a dining room, a wooden floor room, or a toilet) is not found from only the division into room regions. Accordingly, the integration unit 260 identifies the type of room or the like from results of the detection by the character recognizing unit 240 and the fixture detecting unit 250.

As described above, the character recognizing unit 240 detects a character string included in the floor plan image (FIG. 10(*a*)). In an example of FIG. 10, character strings "DK 7", "Wooden floor room 4.5", "Tatami room 6","Closet", "Entrance", etc. enclosed in dotted lines in FIG. 10(*c*) are detected. The character recognizing unit 240 refers to the room type dictionary 1001 with the detected character strings as a key and thereby can identify "kitchen-cum-dining room", "Wooden floor room", "Tatami room", "Closet", etc. that are the types of rooms. The integration unit 260 collates the position of a character string (in this example, "DK 7") by which the type of room such as "kitchen-cum-dining room" is identified and a region detected by the region segmentation unit 230, and thereby can identify which region corresponds to "kitchen-cum-dining room". Incidentally, the character recognizing unit 240 can identify information of the area (the number of tatami mats) of each room as well from the character string in the floor plan image and associate the information with the room.

As described above, the fixture detecting unit 250 detects a fixture sign included in the floor plan image (FIG. 10(*a*)). In an example of FIG. 10, fixture signs such as a toilet bowl (toilet), a bathtub (bath), a built-in kitchen (kitchen), etc. enclosed with dashed lines in FIG. 10(*c*) are detected. Therefore, the integration unit 260 collates the position of such a fixture sign and a region detected by the region segmentation unit 230, and thereby can identify which region corresponds to a "toilet" or a "bath".

Subsequently, an integration process of a complemented room structure (FIG. 11(*a*)) obtained through the processing described with reference to FIG. 9 and room type information (FIG. 11(*b*)) obtained through the processing described with reference to FIG. 10 is described with reference to FIG. 11. Incidentally, in the complemented room structure shown in FIG. 11(*a*), a portion estimated to be a wall, a portion estimated to be a door, a portion estimated to be a sliding door, and a portion estimated to be a window are managed separately. As described above, for example, a portion identified by a door sign can be managed as a door; a complemented portion between rooms can be managed as a sliding door; a complemented portion between the outside and a room can be managed as a window.

Figure 11:
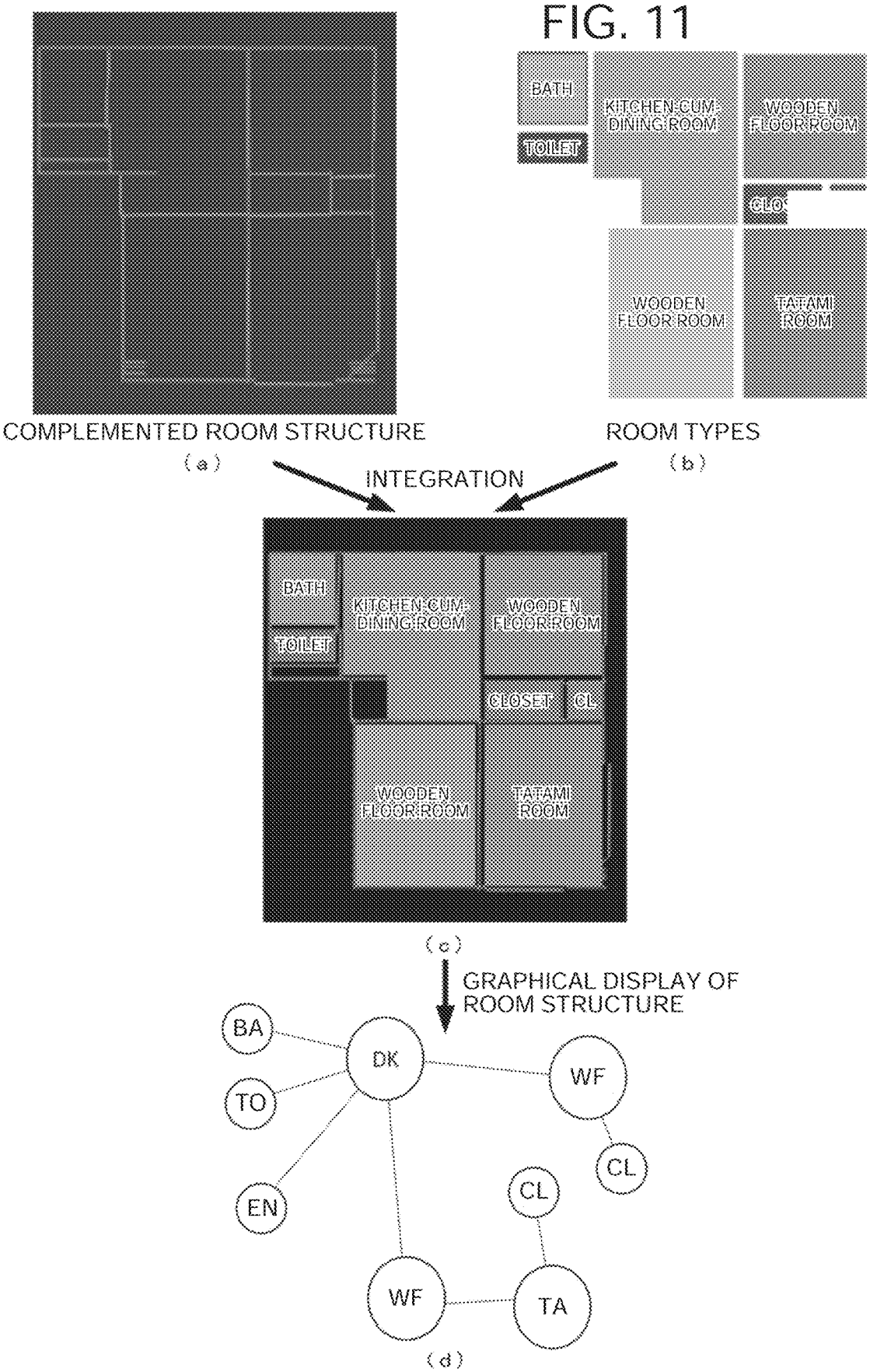
FIG. 11 is a diagram for explaining an embodiment of part of processing by the floor-plan identifying unit shown in FIG. 2.

The integration unit 260 collates the complemented room structure shown in FIG. 11(*a*) and the room whose room type has been identified shown in FIG. 11(*b*) (FIG. 11(*c*)). Then, the integration unit 260 represents the room structure of this floor plan in a graphic form (FIG. 11(*d*)). In this graph structure, each room is represented as a node. In an example of FIG. 11(*d*), "kitchen-cum-dining room" is simplistically represented as "DK", and "entrance" is simplistically represented as "EN". A connection relationship between rooms (a window, a door, a sliding door, etc.) is represented as a link. For example, in a case where the kitchen-cum-dining room and a wooden floor room are estimated to be connected by a sliding door, a link is set between a node of the kitchen-cum-dining room and a node of the wooden floor room.

In the graph of the room structure generated in this way, if there is a room that is not connected to any other rooms, it is conceivable that there is an error in the estimated room structure. Therefore, in this case, the floor-plan identifying unit 200 again performs the line-segment detection process, the room-structure complementation process, etc., changing the parameters. If the generated graph structure has no big problem, a concrete example shown in FIG. 11(*c*) is passed as a floor-plan analysis result to the output unit 270.

2.3 Functional Configuration of Model Generating Unit 300

Figure 12:
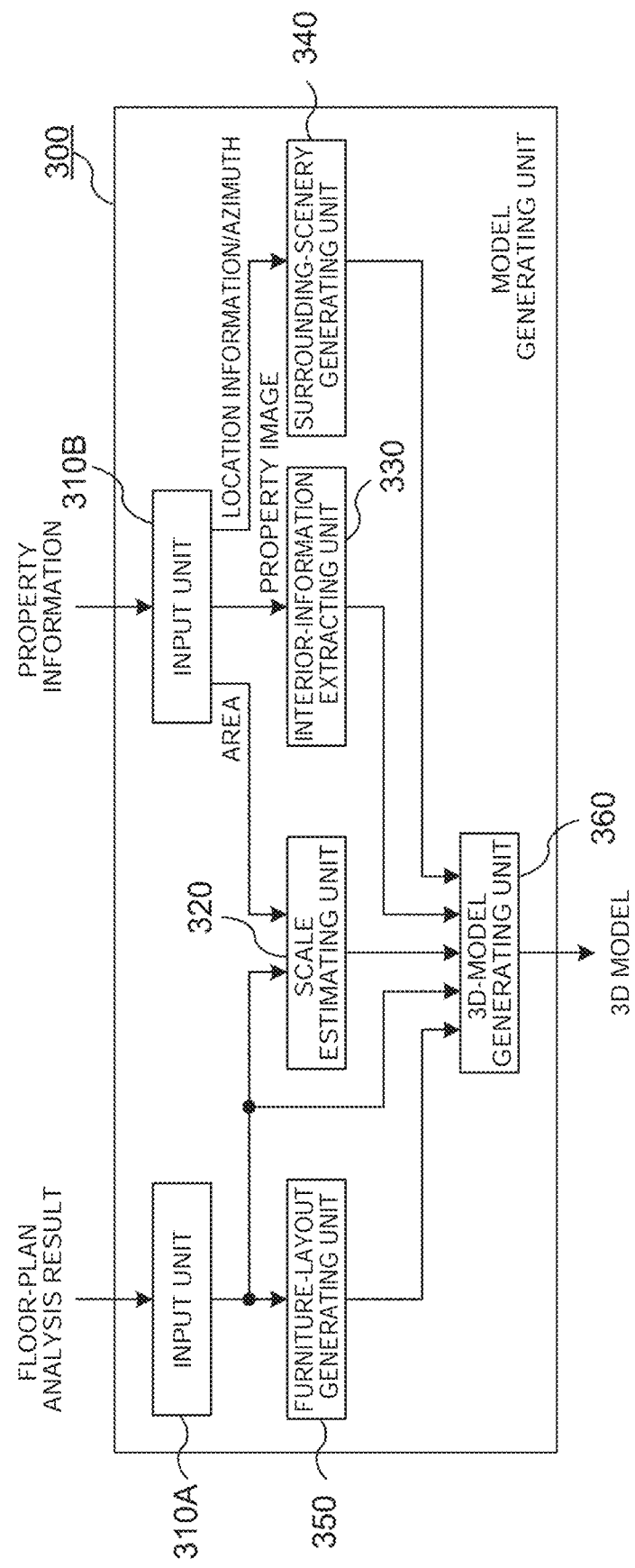
FIG. 12 is a diagram showing a functional configuration of a model generating unit of the information processing apparatus shown in FIG. 1.

Subsequently, the functional configuration of the model generating unit 300 is described with reference to FIG. 12. As shown in FIG. 12, the model generating unit 300 includes input units 310A and 310B, a scale estimating unit 320, an interior-information extracting unit 330, a surrounding-scenery generating unit 340, a furniture-layout generating unit 350, and a 3D-model generating unit 360.

The input unit 310A receives an input of a floor-plan analysis result output from the floor-plan identifying unit 200 shown in FIG. 1. Then, the input unit 310B receives an input of each piece of property information input from the input unit 100B shown in FIG. 1. The property information input from the input unit 100B includes, for example, photos shot inside a property, location information (the address, the latitude/longitude, or the like), and information such as the azimuth, the floor number, the age of the property, and the exclusive area.

The scale estimating unit 320 estimates the scale of a floor plan pertaining to the floor-plan analysis result. The property information includes information of the exclusive area; however, the area within the outer edge of the floor plan pertaining to the floor-plan analysis result is considered to correspond to the exclusive area of the property, and therefore the scale estimating unit 320 calculates the scale according to the proportion between the two.

The interior-information extracting unit 330 analyzes an interior image of the property input from the input unit 310B. Specifically, the interior-information extracting unit 330 performs a texture extracting process, a room structure analysis (for example, an estimate of the height of a room), etc. Details of processing by the interior-information extracting unit 330 will be described later with reference to FIGS. 13 and 14.

The surrounding-scenery generating unit 340 generates scenery information of the day and night scenery viewed from a window or the like of the property and sunlight information. Specifically, when the location information (for example, latitude/longitude information or address information) of the property, information of the aspect of the property, and floor number information (height information) have been input from the input unit 310B, the surrounding-scenery generating unit 340 acquires scenery information from a scenery generating service on the Internet (for example, Google® Earth), astronomical information, sunshine duration data, etc.

The furniture-layout generating unit 350 generates 3D furniture information so that a user can imagine what kind of furniture is able to be arranged in a 3D model of the property. The 3D furniture information generated at this time can be prepared in advance, for example, for each type of room in which furniture is arranged. A combination of a sofa and a table in a living room, a combination of a dining table and dining chairs in a dining room, etc. can be prepared as a prepared 3D furniture model. The scale of furniture arranged in the 3D model of the property can be adjusted according to the scale estimated by the scale estimating unit 320. Incidentally, if a 3D furniture model is not arranged in the 3D model of the property, the furniture-layout generating unit 350 is unnecessary.

Figure 15:
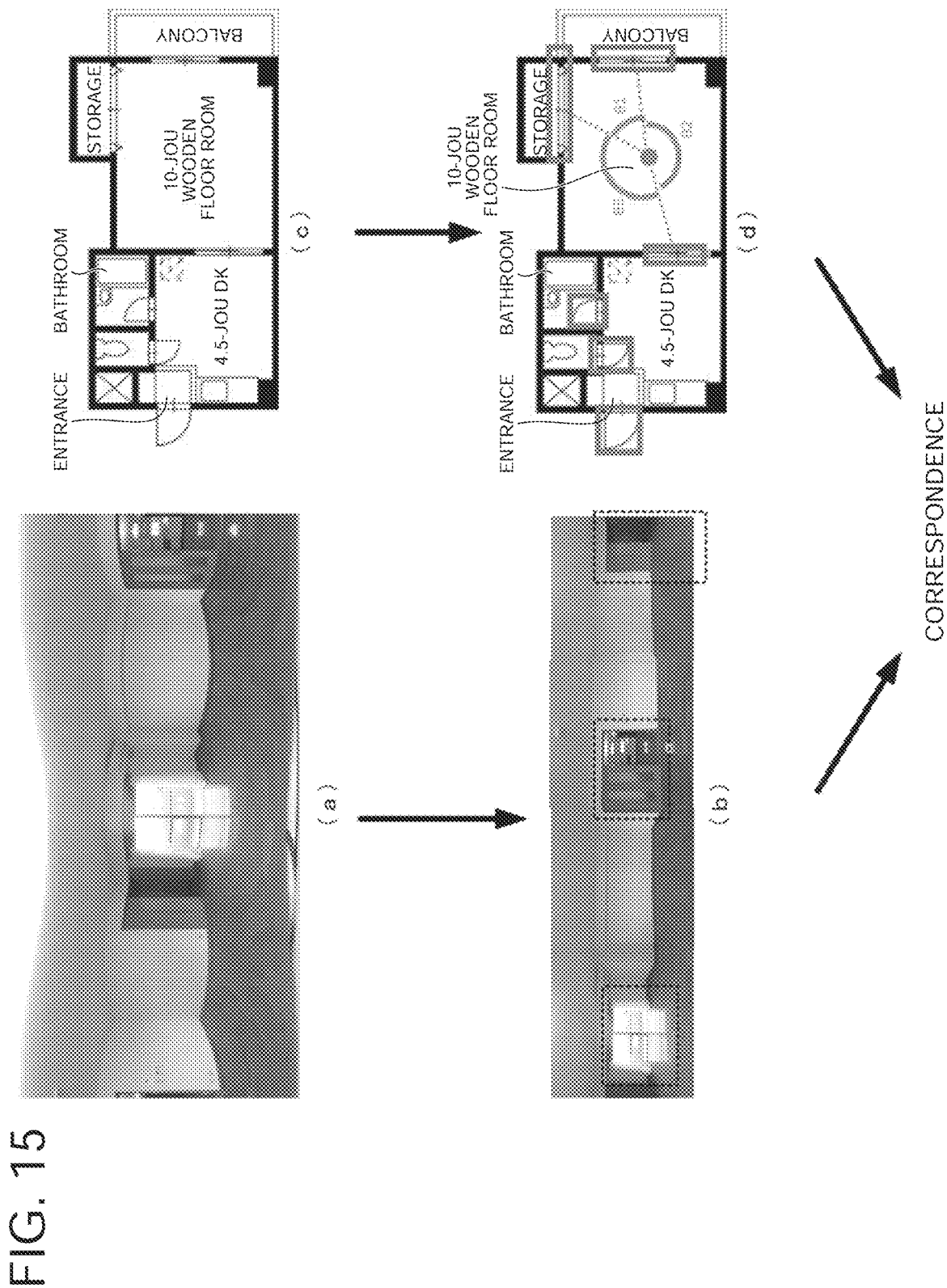
FIG. 15 is a diagram for explaining an embodiment of part of processing by the model generating unit shown in FIG. 12.

The 3D-model generating unit 360 generates a 3D model of the property by integrating the input floor-plan analysis result and respective pieces of information generated by the scale estimating unit 320, the interior-information extracting unit 330, the surrounding-scenery generating unit 340, and the furniture-layout generating unit 350. Specifically, for example, by giving a two-dimensional floor plan obtained as a floor-plan analysis result the height detected by the interior-information extracting unit 330, the property can be represented in three dimensions. Furthermore, a three-dimensional model including the texture is generated by applying the texture information of the floor, walls, etc. extracted by the interior-information extracting unit 330 to the three-dimensional property. By combining this with the scenery information generated by the surrounding-scenery generating unit 340 and the 3D furniture model generated by the furniture-layout generating unit 350, the view from a window, the furniture arranged in the interior of the property, etc. can be reproduced on the 3D model. Part of processing by the 3D-model generating unit 360 will be described later with reference to FIG. 15.

2.3.1 Texture Extracting Process

Figure 13:
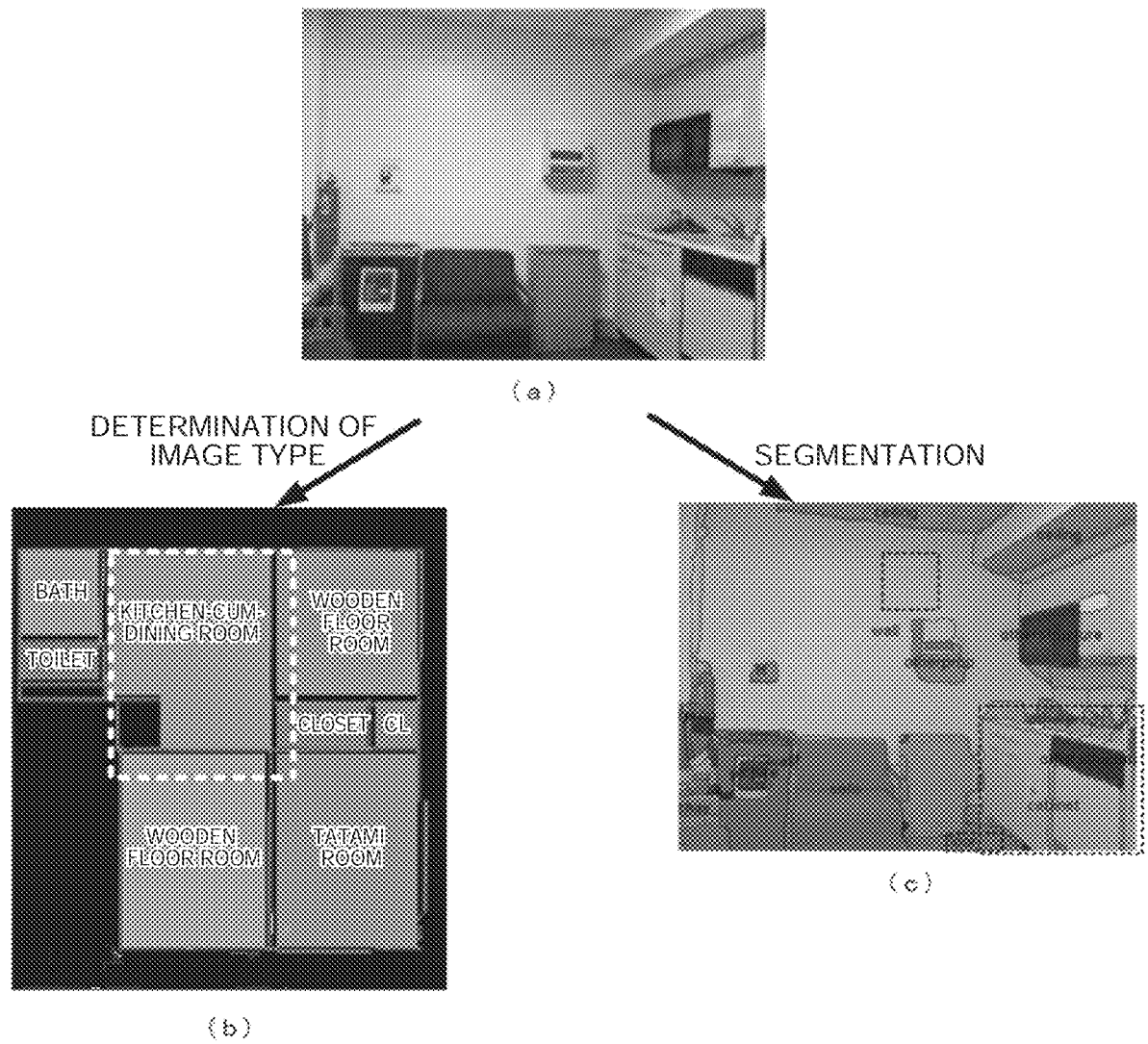
FIG. 13 is a diagram for explaining an embodiment of part of processing by the model generating unit shown in FIG. 12.

A process of extracting texture from an interior image performed by the interior-information extracting unit 330 is described below with reference to FIG. 13. As described above, the interior-information extracting unit 330 performs a process of extracting the texture of the walls, the floor, and the ceiling inside the property from the interior image input as part of property information. The extracted texture is applied to the walls and the floor when a 3D model is generated by the 3D-model generating unit 360. To do this, it is necessary to identify which room (the kitchen, the living room, or another room) the interior image to be processed is an image of. Furthermore, you have to identify which portion of the image the texture to be applied to the floor, the walls, etc. is to be extracted from.

Which type of room the interior image corresponds to can be determined by, for example, a classifier generated by deep learning. The classifier for determining the room can be generated by the same method as, for example, the detector for detecting a fixture sign described with reference to FIGS. 7 and 8. Specifically, for example, many images of the kitchen that are correct data and images of rooms other than the kitchen, such as many images of the bath and the living room, that are incorrect data are input as training data, and it can be generated by deep learning. As many such classifiers as the number of types of rooms are prepared, and, for example, the most probable type of room can be set as a room corresponding to the input interior image.

Next, the extraction of texture is described. In the extraction of texture, i.e., the color, pattern, assumed raw material, etc., first, what is shown in an interior photo and which portion of the interior photo it is in are identified, and then the feature of, for example, a portion where a wall is shown or a portion where a floor is shown is analyzed. Therefore, first, segmentation needs to be performed in order to identify what is shown in a photo and which position in the photo it is in.

A segmentation process can be performed, for example, by a deep learning model. First, prepare training data where which region of an interior photo corresponds to what, such as a wall, a sofa, a bed, or a table, is tagged by one's hand. And let a deep learning model designed for segmentation learn the training data. The interior photo to be processed is input to the learned deep learning model generated in this way, thereby a segmented image shown in FIG. 13(c) as an example is generated. As a result, regions detected as a wall, a floor, a kitchen, etc. (for example, dotted regions in FIG. 13(c) indicating characteristic portions of the room) can be extracted as texture.

2.3.2 Structural Analysis of Room Image

Figure 14:
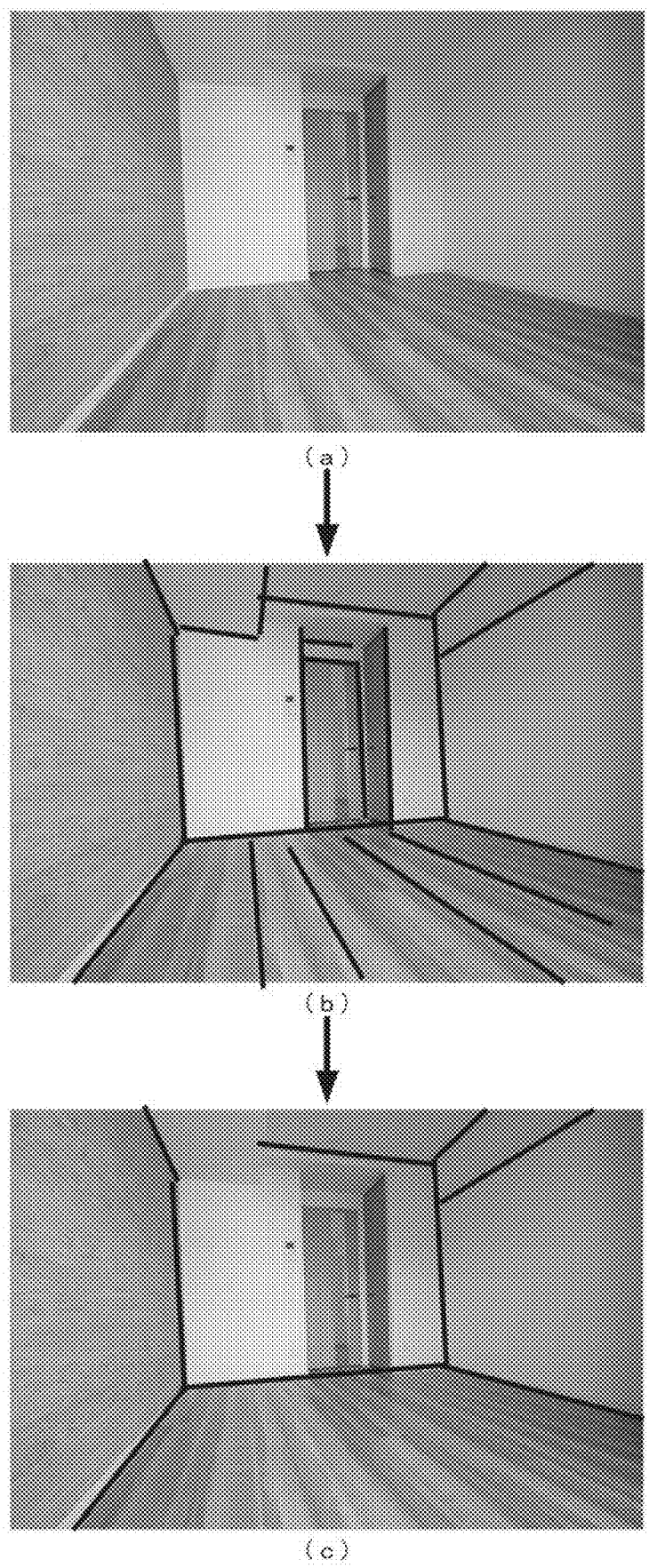
FIG. 14 is a diagram for explaining an embodiment of part of processing by the model generating unit shown in FIG. 12.

The structural analysis of a room image is described below with reference to FIG. 14. By combining the structural analysis of the room image with a floor-plan analysis result or the like, the height or the like of the ceiling of the room can be estimated.

An interior image shown in FIG. 14(a) is input, and a line-segment detection process is performed on the interior image, and then an image shown in FIG. 14(b) is generated. In FIG. 14(b), detected line segments are depicted in a thick line. Looking at FIG. 14(b), in addition to the boundaries of walls, the boundaries between a floor and the walls, the boundaries between a door and the walls, etc., portions of the boundaries of wood veneers of the floor, etc. are also detected as a line segment.

A line-segment detection result is applied to an energy function. The energy function is defined in consideration of the lengths and intersections of line segments, the configuration of the corners, etc. For example, line segments that are long, and intersect at the end of the image, and compose a corner with three points are likely to be boundary line segments composing the room, and therefore can define an energy function. Accordingly, if such an energy function is applied to the line segment detection shown in FIG. 14(b), the boundaries of the surfaces of the walls, the boundaries between the floor and the walls, the boundaries between the walls and the ceiling, etc. are detected as line segments as shown in FIG. 14(b).

When the line segments of the boundaries of the surfaces of the walls, the boundaries between the floor and the walls, and the boundaries between the walls and the ceiling that compose the structure of the room have been identified in this way, the ratio of the width of the floor plan to the height of the ceiling can be identified. Accordingly, in the 3D-model generating unit 360, by combining the scale of the property estimated from the floor-plan analysis result and the area of the property with the structure analysis result in the interior-information extracting unit 330, the ceiling height can be estimated.

Incidentally, the ceiling-height estimating method in the 3D-model generating unit 360 is not limited to this. For example, a technique using the fact that the building code differs according to the building year is also conceivable. In this case, it is conceivable that a table of the average ceiling height in each building year is prepared in advance, and the ceiling height according to the building year acquired from property information is applied. Furthermore, in a case where the standardization of specifications is seen in properties of a type of a client, such as a public corporation, a table of this standard is prepared.

2.3.3 Texture Application Process

An embodiment of part of processing pertaining to the 3D-model generating unit 360 is described below. As described above, in the interior-information extracting unit 330, in what type of room and what type of texture is to be applied to the floor, the walls, the ceiling, etc. are identified. Therefore, the 3D-model generating unit 360 can apply the texture extracted in the interior-information extracting unit 330 to the floor, the walls, the ceiling, etc. of a room corresponding to the type in the floor-plan analysis result.

Alternatively, in a case where a circumferentially-shot panoramic image of a room is able to be acquired, it is conceivable to set the panoramic image is position and then directly paste it as texture. FIG. 15(a) shows a concrete example of the panoramic image. The interior-information extracting unit 330 performs curve compensation on the image. Furthermore, the interior-information extracting unit 330 identifies structures shown in the image by segmentation and also identifies their positional relationship (relative angle) (FIG. 15(b)).

The 3D-model generating unit 360 having received the information searches for a room corresponding to the relative positional relationship of the structures in structures of rooms included in the floor-plan analysis result. For example, if there is a room where the relative angle of a door, a window, and a storage door roughly corresponds to the relative angle identified from the panoramic image, it turns out that the room corresponds to the panoramic image. Therefore, the 3D-model generating unit 360 can set the structures in position and then apply the panoramic image as texture of the room.

3 Hardware Configuration

Figure 16:
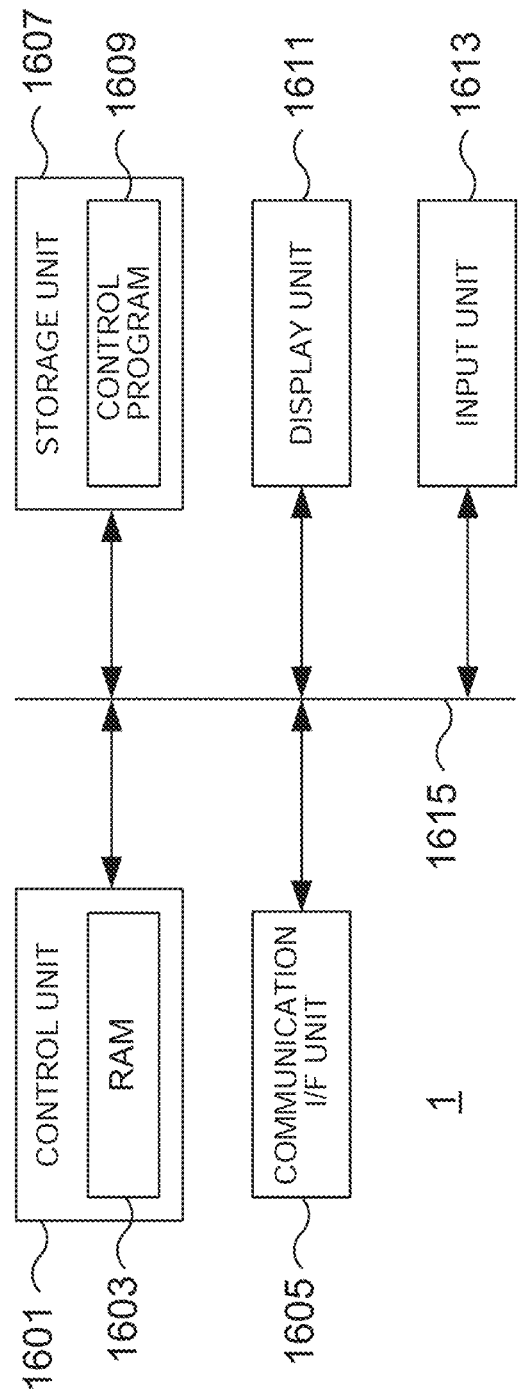
FIG. 16 is a diagram showing a concrete example of a hardware configuration of the information processing apparatus according to the embodiment.

A hardware configuration of the information processing apparatus 1 is described with reference to FIG. 16. As shown in FIG. 16, the information processing apparatus 1 includes a control unit 1601, a communication interface (I/F) unit 1605, a storage unit 1607, a display unit 1611, and an input unit 1613; these units are connected via a bus line 1615.

The control unit 1601 includes a central processing unit (CPU) (not shown), a read only memory (ROM) (not shown), a random access memory (RAM) 1603, etc. The control unit 1601 executes a control program 1609 stored in the storage unit 1607, thereby is configured to have functions of a general computer and be able to execute the above-described process of generating a 3D model from a floor plan image and property information. For example, the input units 100A and 100B, the floor-plan identifying unit 200, the model generating unit 300, and the output unit 400 described above with reference to FIG. 1 can be realized as the control program 1609 that is temporarily stored in the RAM 1603 and then runs on the CPU.

Furthermore, besides codes included in the control program 1609, the RAM 1603 temporarily holds therein some or all of the input floor plan image and other property information, etc. Moreover, the RAM 1603 is also used as a work area when the CPU performs various processes.

The communication I/F unit 1605 is a device for wired or wireless data communication with an external device as needed. For example, the floor plan image and the other property information may be the ones received from the communication I/F unit 1605. Furthermore, the created 3D model can be transmitted to, for example, a client terminal via a network through the communication I/F unit 1605.

The storage unit 1607 is a non-volatile storage medium such as a hard disk drive (HDD) or a flash memory. The storage unit 1607 stores therein an operating system (OS) and applications for realizing functions of a general computer, and data (not shown). Furthermore, the storage unit 1607 stores therein the control program 1609. As described above, the input units 100A and 100B, the floor-plan identifying unit 200, the model generating unit 300, and the output unit 400 shown in FIG. 1 can be included in the control program 1609.

The display unit 1611 is a display device for presenting a variety of information to a user. Concrete examples of the display unit 1611 include, for example, a liquid crystal display, an organic electro-luminescence display, and the like. The 3D model output from the output unit 400 can be displayed on the display unit 1611.

The input unit 1613 is a device for accepting an input from an administrator. Concrete examples of the input unit 1613 include a keyboard and mouse, a touch panel, etc.

Incidentally, the information processing apparatus 1 does not always have to include the display unit 1611 and the input unit 1613. Furthermore, the display unit 1611 and the input unit 1613 can be externally connected to the information processing apparatus 1 via various interfaces such as a universal serial bus (USB) and a display board.

4 Effects of Present Embodiment

As described above, the information processing apparatus 1 according to the present embodiment automatically generates a 3D model of a real-estate property from property information including a floor plan image, interior photos, etc. Accordingly, based on the generated 3D model, the information processing apparatus enables the room viewing and interior simulation in virtual reality. Furthermore, the guidance for viewing or the like is also made possible through a call to sales staff of a real-estate company in a virtual space of the 3D model. In addition, the sale of the property and the sale of furniture can also be consolidated by having an interior coordinator's proposal for the interior in the virtual space.

5 Note

The embodiment described above is for ease of understanding of the present invention, and is not for interpreting the present invention limitedly. Components and their arrangement, material, the conditions, the shape, the size, etc. included in the embodiment are not limited to those provided as an example and can be arbitrarily changed. Furthermore, configurations shown in different embodiments can be partially replaced or combined.

REFERENCE SIGNS LIST

1 information processing apparatus
70 information processing apparatus
71 input unit
73 image-feature-amount calculating unit
75 machine-learning-model generating unit
77 output unit
100A, 100B input unit
200 floor-plan identifying unit
210 input unit
220 line-segment detecting unit
230 region segmentation unit
240 character recognizing unit
250 fixture detecting unit
260 integration unit
270 output unit
300 model generating unit
310A, 310B input unit
320 scale estimating unit
330 interior-information extracting unit
340 surrounding-scenery generating unit
350 furniture-layout generating unit
360 3D-model generating unit
400 output unit
1601 control unit
1603 RAM
1605 communication I/F (interface) unit
1607 storage unit
1609 control program
1611 display unit
1613 input unit
1615 bus line

What is claimed is:

1. An information processing apparatus configured to:
receive property information comprising a floor plan image of a real-estate property over a network;
generate floor plan information based on an analysis of the floor plan image;
generate a three-dimensional model of the real-estate property using the floor plan information; and
display the three-dimensional model of the real-estate property on a display;
wherein generate floor plan information based on an analysis of the floor plan image comprises:
performing a contraction process and then a line-segment detection process on an image resulting from a binarization process performed on the floor plan image, and performing clustering on detected line segments, thereby detecting a line segment corresponding to a wall on a floor plan;
performing opening of a morphological operation, which is a combination of an expansion process and a contraction process, and then performing a segmentation process on the floor plan image, thereby identifying a room region corresponding to a room on the floor plan;
recognizing a character string included in the floor plan image;
detecting a fixture sign included in the floor plan image; and
identifying a type of room of the room region on the basis of the identified room region, a result of recognition of the character string, and a result of detection of the fixture sign, and complementing a room structure on the basis of the room region and a detected line-segment;
wherein generate a three-dimensional model of the real-estate property using the floor plan information comprises:
estimating a scale of the floor plan on the basis of the floor plan identified from the floor plan information and area information included in the property information; and
generating a three-dimensional model of the real-estate property on the basis of the floor plan identified from the floor plan information, the scale, and an estimated ceiling height; and
wherein display the three-dimensional model of the real-estate property on a display comprises displaying the three-dimensional model of the real-estate property on the display on the basis of the floor plan identified from the floor plan information, the scale, and the estimated ceiling height.

2. The information processing apparatus according to claim 1, wherein the property information further comprises an interior photo shot in the real-estate property, and
wherein generate a three-dimensional model of the real-estate property using the floor plan information further comprises identifying one or more subjects shown in the interior photo by a segmentation process on the interior photo, extracting portions of the subjects corresponding to at least a wall and a floor as texture, and applying the texture to, of rooms included in the three-dimensional model, a room estimated to correspond to the interior photo.

3. The information processing apparatus according to claim 2, wherein generate a three-dimensional model of the real-estate property using the floor plan information further comprises identifying a ratio of a line on a four-side plane and a line in a height direction from detection of line segments in the interior photo and an estimate of a boundary line segment based on an energy function, and estimating the ceiling height according to the floor plan, the scale, and the ratio.

4. The information processing apparatus according to claim 1 or 2, wherein generate a three-dimensional model of the real-estate property using the floor plan information further comprises estimating the ceiling height according to building year of the real-estate property.

5. The information processing apparatus according to any one of claims 1 to 4, wherein the property information further comprises location information of the real-estate property, and
wherein generate a three-dimensional model of the real-estate property using the floor plan information further comprises acquiring scenery information of the real-estate property from the location information, and applying the scenery information to the three-dimensional model.

6. An information processing method for an information processing apparatus comprising a processor configured to perform the information processing method, wherein the information processing method comprises:
a first step of receiving an input of a floor plan image of a real-estate property;
a second step of receiving an input of property information including area information of the real-estate property;
a third step of generating floor plan information on the basis of the floor plan image;
a fourth step of generating a three-dimensional model of the real-estate property using the floor plan information; and
a fifth step of displaying the generated three-dimensional model on an electronic display,
wherein the third step comprises:
a step of performing a contraction process and then a line-segment detection process on an image resulting from a binarization process performed on the floor plan image, and performing clustering on detected line segments, thereby detecting a line segment corresponding to a wall on a floor plan;
a step of performing opening of a morphological operation, which is a combination of an expansion process and a contraction process, and then a segmentation process on the floor plan image, thereby identifying a room region corresponding to a room on the floor plan;
a step of recognizing a character string included in the floor plan image;
a step of detecting a fixture sign included in the floor plan image; and
a step of identifying a type of room of the room region on the basis of the identified room region, a result of recognition of the character string, and a result of detection of the fixture sign, and complementing a room structure on the basis of the room region and a result of the line-segment detection, wherein the fourth step comprises:
a step of estimating a scale of the floor plan on the basis of the floor plan identified from the floor plan information and the area information included in the property information; and
a step of generating a three-dimensional model of the real-estate property on the basis of the floor plan identified from the floor plan information, the scale, and an estimated ceiling height, and
wherein the fifth step of displaying the generated three-dimensional model on an electronic display comprises displaying the three-dimensional model of the real-estate property on the electronic display on the basis of the floor plan identified from the floor plan information, the scale, and the estimated ceiling height.

7. A program causing a processor of an information processing apparatus to execute:
a first process of receiving an input of a floor plan image of a real-estate property;
a second process of receiving an input of property information including area information of the real-estate property;
a third process of generating floor plan information on the basis of the floor plan image;
a fourth process of generating a three-dimensional model of the real-estate property using the floor plan information; and
a fifth process of displaying the generated three-dimensional model on a user interface,
wherein the third process comprises:
a process of performing a contraction process and then a line-segment detection process on an image resulting from a binarization process performed on the floor plan image, and performing clustering on detected line segments, thereby detecting a line segment corresponding to a wall on a floor plan;
a process of performing opening of a morphological operation, which is a combination of an expansion process and a contraction process, and then a segmentation process on the floor plan image, thereby identifying a room region corresponding to a room on the floor plan;
a process of recognizing a character string included in the floor plan image;
a process of detecting a fixture sign included in the floor plan image; and
a process of identifying a type of room of the room region on the basis of the identified room region, a result of recognition of the character string, and a result of detection of the fixture sign, and complementing a room structure on the basis of the room region and a result of the line-segment detection,
wherein the fourth process comprises:
a process of estimating a scale of the floor plan on the basis of the floor plan identified from the floor plan information and the area information included in the property information; and
a process of generating a three-dimensional model of the real-estate property on the basis of the floor plan identified from the floor plan information, the scale, and an estimated ceiling height, and
wherein the fifth process of displaying the generated three-dimensional model on a user interface comprises displaying the three-dimensional model of the real-estate property on the user interface on the basis of the floor plan identified from the floor plan information, the scale, and the estimated ceiling height.

* * * * *